United States Patent [19]
Batra

[11] Patent Number: 5,249,133
[45] Date of Patent: Sep. 28, 1993

[54] METHOD FOR THE HIERARCHICAL COMPARISON OF SCHEMATICS AND LAYOUTS OF ELECTRONIC COMPONENTS

[75] Inventor: Pradeep Batra, Sunnyvale, Calif.

[73] Assignee: Sun Microsystems, Inc., Mountain View, Calif.

[21] Appl. No.: 684,047

[22] Filed: Apr. 10, 1991

[51] Int. Cl.$^5$ ............................................. G06F 15/60
[52] U.S. Cl. ..................................... 364/489; 364/488
[58] Field of Search ............... 364/488, 489, 490, 491, 364/578

[56] References Cited

U.S. PATENT DOCUMENTS

| | | | |
|---|---|---|---|
| 4,827,427 | 5/1989 | Hyduke | 364/489 |
| 5,005,136 | 4/1991 | Van Berkel et al. | 364/490 |
| 5,067,091 | 11/1991 | Nakazawa | 364/490 |
| 5,084,824 | 1/1992 | Lam et al. | 364/490 |
| 5,164,908 | 11/1992 | Igarashi | 364/491 |

OTHER PUBLICATIONS

"Hierarchical Functional Verification for Cell-Based Design Styles" by Chen et al., IEEE Proceedings, vol. 134, Pt. G, No. 2, Apr. 1987, pp. 103–109.
"Programs for Verifying Circuit Connectivity of MOS/LSI Mask Art Work" by Takashima et al., IEEE 19th Design Automation Conf., 1982, pp. 544–550.
"Automatic Generation of Digital System Schematic Diagrams" by A. Arya et al., IEEE 22nd Design Automation Conf., 1985, pp. 388–395.

*Primary Examiner*—Vincent N. Trans
*Attorney, Agent, or Firm*—Blakely Sokoloff Taylor & Zafman

[57] ABSTRACT

The present invention takes advantage of the hierarchical nature of the design to perform a hierarchical comparison on as many blocks and sub-blocks which can be matched between the layout and the logic design. Because the internal connections were previously verified when the first occurrence of the block was compared, repetition of lengthy comparisons of multiple occurrences of the same blocks in the designs is avoided and subsequent comparisons are performed simply by comparing the input and output connections to the block.

21 Claims, 27 Drawing Sheets snet.hier.lvs

;;;;;;;;;;;;;;;;;;;;;;;;;;;;;;;;;;;;;;;;;;;;;;;;;;;;;;;;;;;;;;;;;;;;;;;;;;;;;;;;;;;;;;

; SUNCOMP Netlist:
;
; Block: /home/bhalu/batra/layout/patent2/schematic/current
; Netlist Time: Wed Jan 23 15:39:20 PST 1991

;;;;;;;;;;;;;;;;;;;;;;;;;;;;;;;;;;;;;;;;;;;;;;;;;;;;;;;;;;;;;;;;;;;;;;;;;;;;;;;;;;;;;;
;
;;;;;;;;;;;;;;;;;;;;;;;;;;;;;;;;;;;;;;;;;;;;;;;;;;;;;;;;;;;;;;;;;;;;;;;;;;;;;;;;;;;;;;

; Sub-Circuit Netlist:
;
; Block: /db/library/std_cell/snr02a/schematic/current
; Last Time Saved: May 21 17:16:48 1990

;;;;;;;;;;;;;;;;;;;;;;;;;;;;;;;;;;;;;;;;;;;;;;;;;;;;;;;;;;;;;;;;;;;;;;;;;;;;;;;;;;;;;;

S snr02a * i1 i2 & out ;
i 3 pfet  3.D i2 vcc! vcc! "w 10  1 .8 "
i 2 pfet  out i1 3.D vcc! "w 10  1 .8 "
i 0 nfet  out i2 vss! vss! "w 2.5  1 .8 "
i 1 nfet  out i1 vss! vss! "w 2.5  1 .8 "
E  snr02a
P  snr02a
;
;;;;;;;;;;;;;;;;;;;;;;;;;;;;;;;;;;;;;;;;;;;;;;;;;;;;;;;;;;;;;;;;;;;;;;;;;;;;;;;;;;;;;;

; Sub-Circuit Netlist:
;
; Block: /db/library/std_cell/sin00a/schematic/current
; Last Time Saved: May  9 16:03:30 1989

```
S sin00a * i1 & out ;
i 1 pfet  out i1 vcc! vcc! "w 5.5  1 .8 "
i 5 nfet  out i1 vss! vss! "w 2.5  1 .8 "
E sin00a
P sin00a
;
```
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
Block: /db/library/std_cell/snd02a/schematic/current
; Last Time Saved: May 21 14:09:23 1990
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
```
S snd02a * i1 i2 &  out ;
i 3 pfet  out i2 vcc! vcc! "w 5.5  1 .8 "
i 2 pfet  out i1 vcc! vcc! "w 5.5  1 .8 "
i 0 nfet  0.D i2 vss!vss! "w 4  1 .8 "
i 1 nfet  out i1 0.D vss! "w 4  1 .8 "
E  snd02a
P  snd02a
;
```
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Main Circuit Netlist:
;
; Block:  /home/bhalu/batra/layout/patent2/schematic/current
; Last Time Saved:  Jan 23 15:37:19 1991
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
```
S patent2 *  in1 in2 in3 in4 &  out1 ;
s snr02a I9 *  ! 0  I1.out  ! 0  I0.out  &  I9.out ;
s sin00a I3 *   I9.out  &  out1 ;
s snd02a I1 *  ! 0  in1 ! 0  in2 &  I1.out ;
s snd02a I0 *  ! 0  in3 ! 0  in4 &   I0.out :
E patent2
EndSubcktDef
```

*Figure 1f*

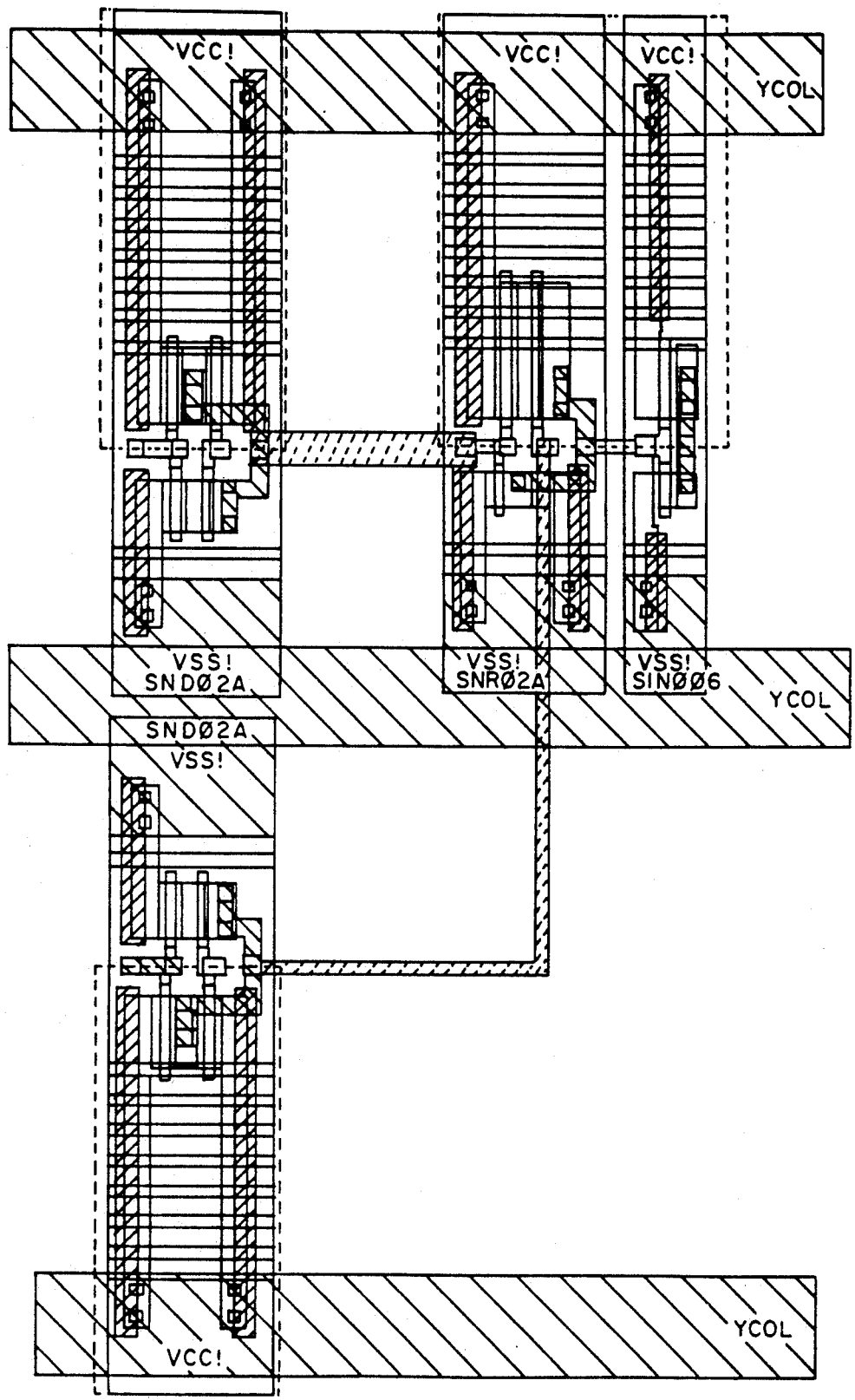
FIG_2A

FIG_2B
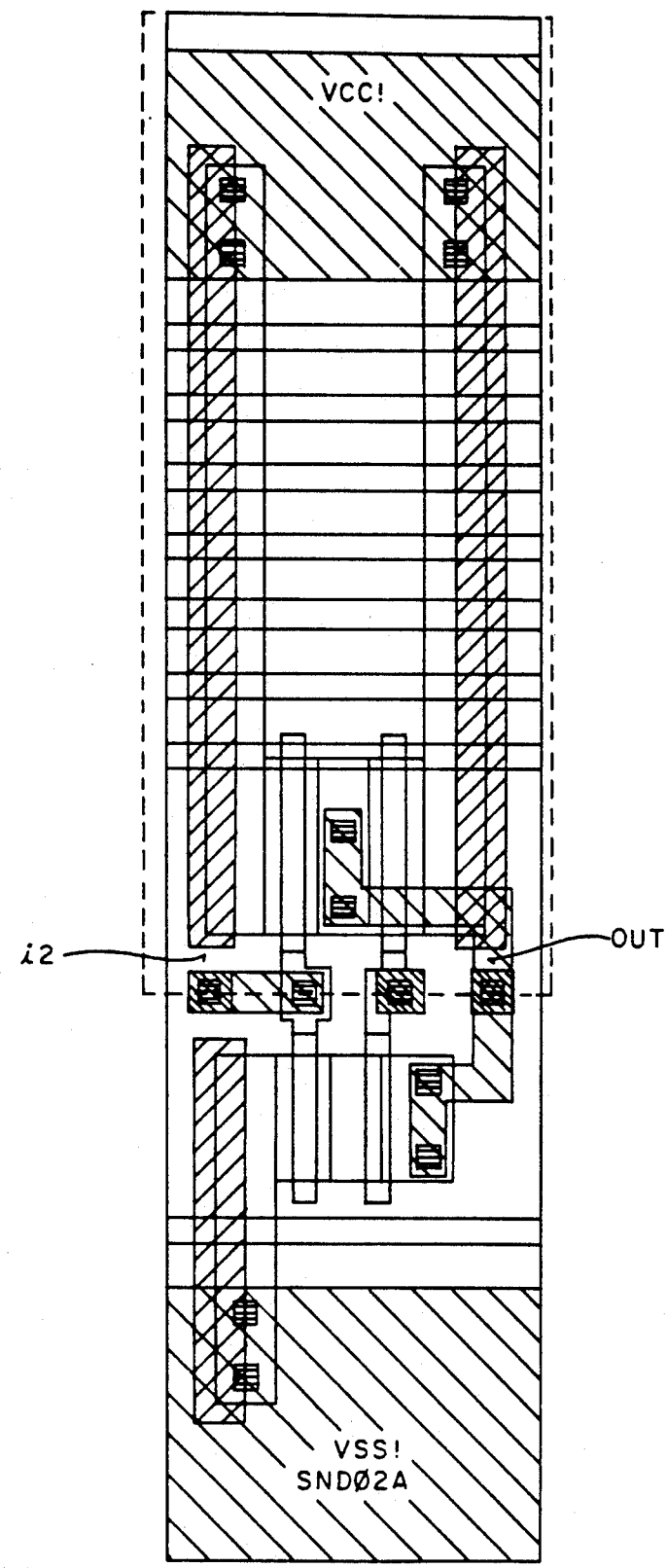

FIG_2C
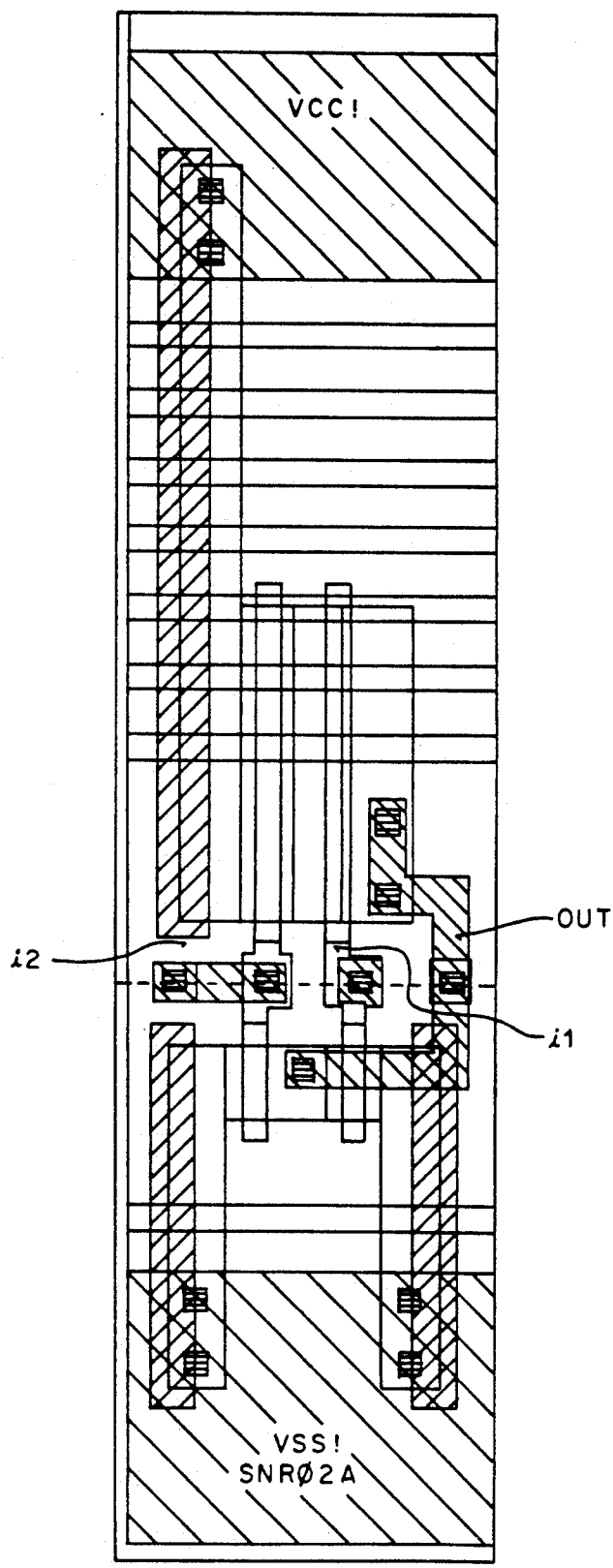

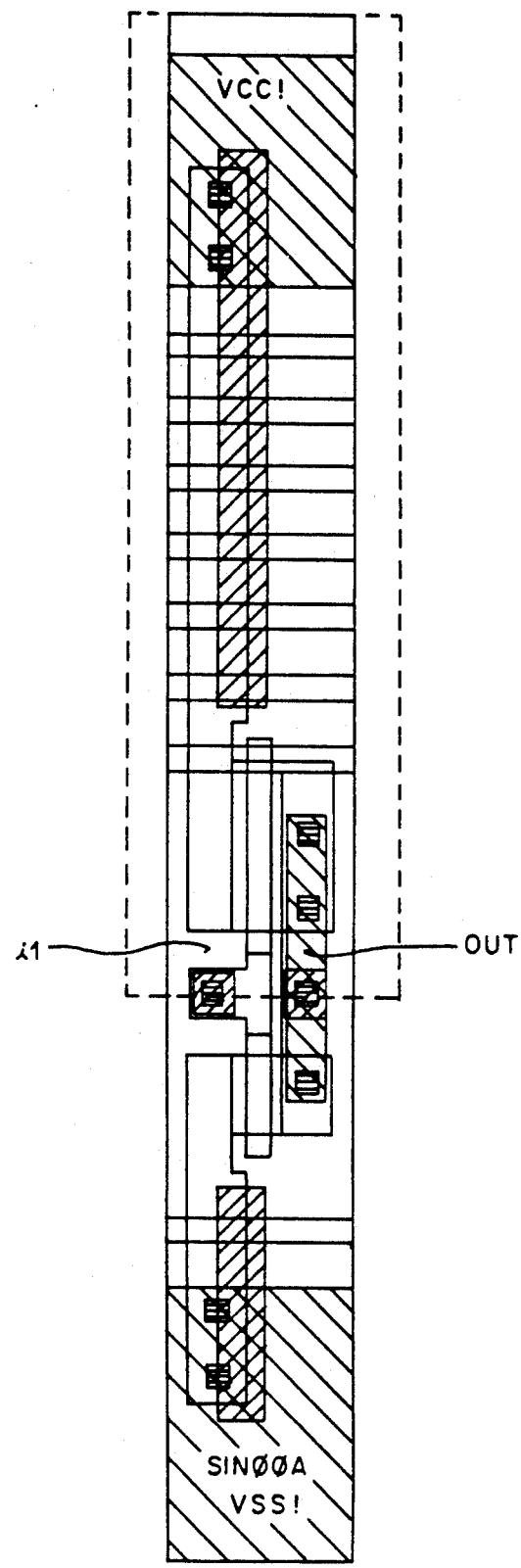
FIG_2D enet.hier.lvs

```
;;;;;;;;;;;;;;;;;;;;;;;;;;;;;;;;;;;;;;;;;;;;;;;;;;;;;;;;;;;;;;;;;;;;;;;;;;;;;;;;;;;
; SUNCOMP Netlist:
;
;Block: /home/bhalu/batra/layout/patent2/macroextract/current
; Netlist Time: Wed Jan 23 16:28:04 PST 1991
;;;;;;;;;;;;;;;;;;;;;;;;;;;;;;;;;;;;;;;;;;;;;;;;;;;;;;;;;;;;;;;;;;;;;;;;;;;;;;;;;;;
;
;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/std_cell/sin00a/flatextract/current
; Last Time Saved: Jul  3 14:19:30 1990
;;;;;;;;;;;;;;;;;;;;;;;;;;;;;;;;;;;;;;;;;;;;;;;;;;;;;;;;;;;;;;;;;;;;;;;;;;;;;;;;;;;
S sin00a *  i1 &  out %  vcc! vss! ;
i +1 pfet out i1 vcc! vcc! "w 5.5 1 .8 "
i +0 nfet out i1 vss! vss! "w 2.5 1 .8 "
E  sin00a
P sin00a
;
;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/std_cell/snr02a/flatextract/current
; Last Time Saved: Oct  9 07:11:46 1990
;;;;;;;;;;;;;;;;;;;;;;;;;;;;;;;;;;;;;;;;;;;;;;;;;;;;;;;;;;;;;;;;;;;;;;;;;;;;;;;;;;;
```

*Figure 2e*

```
S snr02a *  i1 i2 &  out %  vcc! vss! ;
i +3 pfet out i1 2 vcc! "w 10 1 .8 "
i +2 pfet 2 i2 vcc! vcc! "w10 1 .8 "
i +1 nfet vss! i1 out vss! "w 2.5 1 .8 "
i +0 nfet out i2 vss! vss! "w 2.5 1 .8 "
E  snr02a
P snr02a
;
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/std_cell/snd02a/flatextract/current
; Last Time Saved: Sep  5 06:22:19  1990
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
S snd02a *  i1 i2 &  out %  vcc! vss! ;
i +3 pfet vcc! i1 out vcc! "w 5.5 1 .8 "
i +2 pfet out i2 vcc! vcc! "w 5.5 1 .8 "
i +1 nfet out i1 2 vss! "w 4 1 .8 "
i +0 nfet 2 i2 vss! vss! "w 4 1 .8 "
E  snd02a
P snd02a
;
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Main Circuit Netlist:
;
; Block: /home/bhalu/batra/layout/patent2/macroextract/current
; Last Time Saved: Jan 23 16:25:57 1991
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
S patent2 *  in1 in2 in3 in4 out vcc! vss! ;
s sin00a I3 *   8  &    out  %  vcc! vss! ;
s snr02a I2 *   5  6  &   8  %  vcc! vss! ;
s snd02a I1 *   in4  in3  &   5 %  vcc! vss! ;
s snd02a I0 *   in2  in1  &   6 %  vcc! vss! ;
E patent2
EndSubcktDef
```

```
;;;;;;;;;;;;;;;;;;;;;;;;;;;;;;;;;;;;;;;;;;;;;;;;;;;;;;;;;;;;;;;;;;
;;;;;;;;;;;;;;;;;;;;;;;;;;;;;;;;;;;;;;;;;;;;;;;;;;;;;;;;;;;;;;;;;;
; SUNCOMP Netlist:
;
;Block:./fadder/fa_DATA/fr_dp/fr_lgc/fr_Format/fr_muxlgc/schematic/current
; Netlist Time: Wed Jun 20 13:04:12 PDT 1990
;;;;;;;;;;;;;;;;;;;;;;;;;;;;;;;;;;;;;;;;;;;;;;;;;;;;;;;;;;;;;;;;;;
;
;;;;;;;;;;;;;;;;;;;;;;;;;;;;;;;;;;;;;;;;;;;;;;;;;;;;;;;;;;;;;;;;;;
;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/std_cell/soai21b/schematic/current
; Last Time Saved: May 31 16:14:59 1990
;;;;;;;;;;;;;;;;;;;;;;;;;;;;;;;;;;;;;;;;;;;;;;;;;;;;;;;;;;;;;;;;;;
S soai21b * dummy1 ina1 ina2 dummy4 dummy5 dummy6 dummy7 inb1 dummy2 & out dummy3 ;
i 4  pfet 4.D ina2 vcc! "w 16  1 .8 "
i 15 pfet  out ina1 4.D vcc! "w 16  1 .8 "
i 14 pfet  out inb1 vcc! vcc! "w 8.5  1 .8 "
i 16 nfet  1.D ina1 vss! vss! "w 6.5  1 .8 "
i 20 nfet  out inb1 1.D vss! "w 6.5  1 .8 "
i 1  nfet  1.D ina2 vss! vss! "w 6.5  1 .8 "
E soai21b
P soai21b
;
;
;
;
;;;;;;;;;;;;;;;;;;;;;;;;;;;;;;;;;;;;;;;;;;;;;;;;;;;;;;;;;;;;;;;;;;
;;;;;;;;;;;;;;;;;;;;;;;;;;;;;;;;;;;;;;;;;;;;;;;;;;;;;;;;;;;;;;;;;;
; Main Circuit Netlist:
;
;Block:./fadder/fa_DATA/fr_dp/fr_lgc/fr_format/fr_muxlgc/schematic/current
; Last Time Saved: May 17 18:31:13 1990
;;;;;;;;;;;;;;;;;;;;;;;;;;;;;;;;;;;;;;;;;;;;;;;;;;;;;;;;;;;;;;;;;;
S fr_muxlgc *
s soai21b +123 * brad inp1 inp2 d4 d5 d6 d7 inp3 prad & outp drat ;
E fr_muxlgc
EndSubcktDef
```

```
;;;;;;;;;;;;;;;;;;;;;;;;;;;;;;;;;;;;;;;;;;;;;;;;;;;;;;;;;;;;;;;;;;;;;;;;;;;;;;;;;
; SUNCOMP Netlist:
;
;Block:.../fadder/fa_data/fr_dp/fr_lgc/fr_format/fr_muxlgc/schematic/current
; Netlist Time: Wed Jun 20 13:04:12 PDT 1990
;;;;;;;;;;;;;;;;;;;;;;;;;;;;;;;;;;;;;;;;;;;;;;;;;;;;;;;;;;;;;;;;;;;;;;;;;;;;;;;;;
;
;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/std_cell/soai21b/schematic/current
; Last Time Saved: May 31 16:14:59 1990
;;;;;;;;;;;;;;;;;;;;;;;;;;;;;;;;;;;;;;;;;;;;;;;;;;;;;;;;;;;;;;;;;;;;;;;;;;;;;;;;;
S soai21b * ina1 ina2 inb1 & out ;
i 4 pfet  2b ina2 vcc! vcc! "w 16 1.8 "
i 15 pfet  out ina1 2b vcc! "w 16 1.8 "
i 14 pfet  out inb1 vcc! vcc! "w 8.5 1.8 "
i 16 nfet  2a ina1 vss! vss! "w 6.5 1.8 "
i 20 nfet  out inb1 2a vss! "w 6.5  1.8 "
i 1 nfet  2a ina2 vss! vss! "w 6.5 1.8 "
E soai21b
P soai21b
;
;
;
;;;;;;;;;;;;;;;;;;;;;;;;;;;;;;;;;;;;;;;;;;;;;;;;;;;;;;;;;;;;;;;;;;;;;;;;;;;;;;;;;
; Main Circuit Netlist:
;
;Block:.../fadder/fa_data/fr_dp/fr_lgc/fr_format/fr_muxlgc/schematic/current
; Last Time Saved: May 17 18:31:13 1990
;;;;;;;;;;;;;;;;;;;;;;;;;;;;;;;;;;;;;;;;;;;;;;;;;;;;;;;;;;;;;;;;;;;;;;;;;;;;;;;;;
S fr_muxlgc *
s soai21b +123 * inp1 inp2 inp3 & outp ;
E fr_muxlgc
EndSubcktDef
```

*Figure 5b*

SHCOMP ($Revision: S1.0 $)
  (c) Copyright 1990 Sun Micro Systems.
Reading "ns" ...
REading "ne" ...

****************Comparing Subckt soai21b **************
**************************************************************
        Subckt Name        No. Insts:        No. Devices:

Total Devices in soai21b                            6
**************************************************************
Comparing Subckt soai21b schematic to Subckt soai21b layout
Reducing schematic network ...
Reducing layout network ...
6 corresponding node names found.
Initial netowrk trace ...
Full network trace ...
Networks Match ...
Subckts Match Dump of node correspondences to level 10:
            Schematic Node          Layout Node
            --------------          ----------
                    ina1    <->   ina1
                    ina2    <->   ina2
                    inb1    <->   inb1
                    out     <->   out
                    vcc!    <->   vcc!
                    1.D     <->   2a
                    vss!    <->   vss!
                    4.D     <->   2b

*Figure 5c*

!!!!!!!!!!!!!!!!!!!!!!!!!!!!!!!!!!!!!!!!block soai21b LVS Clean!!!!!!!!!!!!!!!!!!!!!!!!!!!!!!!!!

**********************Comparing Subckt fr_muxlgc ****************
****************************************************************
     Subckt Name        No. Insts:       No. Devices:
soai21b                   1                   6
Total Devices in fr_muxlgc             6
****************************************************************
Comparing Subckt fr_muxlgc schematic to Subckt fr_muxlgc layout
Reducing schematic network . . .
Reducing layout network . . .
6 corresponding node names found.
Intitial network trace . . .
Full network trace . . .
Networks Match . . .
Subckts Match Dump of node correspondences to level 10:
             Schematic Node         Layout Node
             ---------------         -----------
                    inp1  <->  inp1
                    inp2  <->  inp2
                    inp3  <->  inp3
                    outp  <->  outp
!!!!!!!!!!!!!!!!!!!!!!!!!!!!!!!!!!!!!!!block fr_muxlgc LVS Clean !!!!!!!!!!!!!!!!!!!!!!!!!!!!!!!!

```
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; SUNCOMP Netlist:
;
; Block: /home/bhalu/batra/layout/synccell4/schematic/current
; Netlist Time: Tue Feb 13 18:38:50 PST 1990
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
;
;
; Sub-Circuit Netlist:
;
; Block: /home/bhalu/batra/layout/synccell4/sync_cell4/schematic/current
; Last Time Saved: Jan 31 09:54:51 1990
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
S sync_cell4 clk d_in d_inbar q qbar ;
i 45 pfet  q qbar vcc! vcc! "w 20 1 .8 "
i 51 pfet qbar q vcc! vcc! "w 20 1 .8 "
i 54 nfet  s4 d_inbar vss! vss! "w 40 1 0.8"
i 53 nfet  s3 d_in vss! vss! "w 40 1 0.8 "
i 55 nfet  q clk s4 vss! "w 40  1 0.8 "
i 43 nfet  q qbar clk s3 vss! "w 40  1 0.8 "
i 44 nfet  q qbar vss! vss! "w 20  1 0.8 "
i 52 nfet qbar q vss! vss! "w 20  1 0.8 "
E sync_cell4
;
;
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /tools/local/etc/sda/lib/viking/nand2/cmos.sch/current
; Last Time Saved: Apr 12 19:02:23 1989
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
```

*Figure 6a*

```
S nand2 A B Y ;
i 2 pfet  Y A vcc! vcc! "w 48 1 .8 "
i 3 pfet  Y B vcc! vcc! "w 48 1 .8 "
i 0 nfet  0.D B vss! vss! "w 32 1 .8 "
i 1 nfet  Y A 0.D vss! vss! "w 32 1 .8 "
E nand2
;
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit netlist:
;
; Block: /db/library/std_cell/snr02c/schematic/current
; Last Time Saved: May 9 16:00:53 1989
;;;;;;;;;;;;;;;;;;;;;;;;;;;;;;;;;;;;;;;;;;;;;;;;;;;;;;;;;;;;;;;;;;;;;;;;;;;;;;;;;;;;;
S snr02c i1 i2 vcc!vcc! "w 27 1 .8 "
i 3 pfet  3.D i2 vcc! vcc! "w 27 1 .8 "
i 2 pfet  out i1 3.D vcc! "w 27 1 .8 "
i 0 nfet  out i2 vss! vss! "w 7  1 .8 "
i 1 nfet  out i1 vss! vss! "w 7  1 .8 "
E snr02c
;
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/std_cell/sin00d/schematic/current
; Last time Saved: May 9 15:56:40 1989
;;;;;;;;;;;;;;;;;;;;;;;;;;;;;;;;;;;;;;;;;;;;;;;;;;;;;;;;;;;;;;;;;;;;;;;;;;;;;;;;;;;;;
S sin00d i1 out ;
i 1 pfet  out i1 vcc! vcc! "w 22  1 .8 "
i 5 nfet  out i1 vss! vss! "w 11 1.8 "
E sin00d
;
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;
```

; Sub-Circuit Netlist:
;
;
; Block: /db/library/std_cell/sor02d/schematic/current
; Last Time Saved: Apr 26 10:30:06 1989
........................................................................................................
))))))))))))))))))))))))))))))))))))))))))))))))))))))))))))))))))))))))))))))))))))))))))))))))))))
S sor02d i1 i2 out ;
s snr02c 9 i1 i2 9.out ;
s sin00d 10 9.out out ;
E sor02d
;
;
;
........................................................................................................
))))))))))))))))))))))))))))))))))))))))))))))))))))))))))))))))))))))))))))))))))))))))))))))))))))
; Sub-Circuit netlist:
;
; Block: /db/library/std_cell/snd02c/schematic/current
; Last Time Saved: May 9 15:59:37 1989
........................................................................................................
))))))))))))))))))))))))))))))))))))))))))))))))))))))))))))))))))))))))))))))))))))))))))))))))))))
S snr02c i1 i2 out ;
i 2 pfet  out i1 vcc! vcc! "w 14  1 .8"
i 3 pfet  out i2 vcc! vcc! "w 14 1.8"
i 1 nfet  out i1 0.D vss! "w 11  1 .8"
i 0 nfet  0.D i2 vss! vss! "w 11 1 .8"
E snd02C
;
;
;
........................................................................................................
))))))))))))))))))))))))))))))))))))))))))))))))))))))))))))))))))))))))))))))))))))))))))))))))))))

*Figure 6c*

```
; Sub-Circuit Netlist:
;
;
; Block: /db/library/std_cell/san02d/schematic/current
; Last Time Saved: Apr 26 10:28:10 1989
;;;;;;;;;;;;;;;;;;;;;;;;;;;;;;;;;;;;;;;;;;;;;;;;;;
S san02d i1 i2 out ;
s snd02c 9 i1 i2 9.out ;
s sin00d 10 9.out out ;
E san02d
;
;
;
;
;
;;;;;;;;;;;;;;;;;;;;;;;;;;;;;;;;;;;;;;;;;;;;;;;;;;
; Main Circuit Netlist:
;
;
; Block: /home/bhalu/batra/layout/synccell4/schematic/current
; Last Time Saved: Jan 29 16:51:57 1990
;;;;;;;;;;;;;;;;;;;;;;;;;;;;;;;;;;;;;;;;;;;;;;;;;;
S synccell4 OUT clkm clks clr d_in ;
s sync_cell4 2 10.out 3.q 3/qbar OUT 2.qbar ;
s sync_cell4 3 11.out I17.out 13.Y 3.q 3.qbar ;
s nand2 13 d_in 16.out 13.Y ;
s sor02d 10 clks clr 10.out ;
s sor02d 11 clkm clr 11.out ;
s sin02d 16 clr 16.out ;
s san02d I17 d_in 16.out I17.out ;
E synccell4
EndSubcktDef
```

*Figure 6d*

```
ne
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; SUNCOMP Netlist:
;
; Block: /home/bhalu/batra/layout/synccell4/macroextract/current
; Netlist Time: Tue Feb 13 18:27:28 PST 1990
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/cells/xscells/sin00d/extracted/current
1 Last Time Saved: Nov 9 15:27:17 1989
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
S sin00d i1 out vcc! vss! ;
i +1 pfet out i1 vcc! vcc! "w 22 1 .8 "
i +0 nfet out i1 vss! vss! "w 11 1 .8 "
E sin00d
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
; Sub-Circuit Netlist:
;
; Block: /db/library/cells/xscells/snd02c/extracted/current
; Last time Saved: Nov 9 16:07:13 1989
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
S snd02c i1 i2 out vcc! vss! ;
i +3 pfet vcc! i1 out vcc! "w 14 1 .8 "
i +2 pfet out i2 vcc! vcc! "w 14 1 .8 "
i +1 nfet out i1 2 vss! "w 11 1 .8 "
i +0 nfet 2 i2 vss! vss! "w 11 1 .8 "
E snd02c
;
;
;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;;
```

*Figure 6e*

; Sub-Circuit Netlist:
;
;
; Block: /db/library/cells/xscells/snr02c/extracted/current
; Last Time Saved: Nov  9 15:57:19 1989
;;;;;;;;;;;;;;;;;;;;;;;;;;;;;;;;;;;;;;;;;;;;;;;;;;;;;;;;;;;;;;;;;;;;;;;;;;;;;;;;;;;;;;
S snr02c i1 i2 out vcc! vss! ;
i +3 pfet out i1 2 vcc! "w 27 1 .8 "
i +2 pfet 2 i2 vcc! vcc! "w 27 1 .8 "
i +1 nfet vss! i1 out vss! "w 7 1 .8 "
i +0 nfet out i2 vss! vss! "w 7 1 .8 "
E snr02c ;
;
;;;;;;;;;;;;;;;;;;;;;;;;;;;;;;;;;;;;;;;;;;;;;;;;;;;;;;;;;;;;;;;;;;;;;;;;;;;;;;;;;;;;;;
; Main Circuit netlist:
;
; Block: /home/bhalu/batra/layout/synccell4/macroextract/current
; Last Time Saved: Feb 13 16:06:28 1990
;;;;;;;;;;;;;;;;;;;;;;;;;;;;;;;;;;;;;;;;;;;;;;;;;;;;;;;;;;;;;;;;;;;;;;;;;;;;;;;;;;;;;;
S synccell4 ;
i +35 pfet 26 OUT vcc! vcc! "w 10 1 .8 "
i +34 pfet vcc! 26 OUT vcc! "w 10 1 .8 "
i +33 pfet OUT 26 vcc! vcc! "w 10 1 .8 "
i +32 pfet vcc! OUT 26 vcc! "w 10 1 .8 "
i +31 pfet 3.qbar 23 vcc! vcc! "w 10 1 .8 "
i +30 pfet vcc! 3.qbar 23 vcc! "w 10 1 .8 "
i +29 pfet 23 3.qbar vcc! vcc! "w 10 1 .8 "
i +28 pfet vcc! 23 3.qbar vcc! "w 10 1 .8 "
i +27 pfet vcc! d_in 13.Y vcc! "w 24 1 .8 "
i +26 pfet 13.Y 4 vcc! vcc! "w 24 1 .8 "
i +25 pfet vcc! 4 13.Y vcc! "w 24 1 .8 "

*Figure 6f*

```
i +24 pfet 13.Y d_in vcc! vcc! "w 24 1 .8 "
i +23 nfet 26 25 24 vss! vss! "w 20  1 .8 "
i +22 nfet 24 23 vss! vss! "w 20 1 .8 "
i +21 nfet vss! 23 22 vss! "w 20 1 .8 "
i +20 nfet 22 25 26 vss! "w 20 1 .8 "
i +19 nfet 26 OUT vss! vss! "w 20 1 .8"
i +18 nfet vss! 26 OUT vss! "w 20 1 .8 "
i +17 nfet OUT 25 20 vss! "w 20 1 .8 "
i +16 nfet 20 3.qbar vss! vss! "w 20 1 .8"
i +15 nfet vss! 3.qbar 18 vss! "w 20 1 .8 "
i +14 nfet 18 25 OUT vss! "w 20 1 .8 "
i +13 nfet 23 17 16 vss! "w 20 1 .8 "
i +12 nfet 16 13.Y vss! vss! "w 20 1 .8 "
i +11 nfet vss! 13.Y 14 vss! "w 20 1 .8 "
i +10 nfet 14 17 23 vss! "w 20 1 .8 "
i +9 nfet 23 3.qbar vss! vss! "w 20 1 .8 "
i +8 nfet vss! 23 3.qbar vss! "w 20 1 .8 "
i +7 nfet 3.qbar 17 13 vss! "w 20 1 .8 "
i +6 nfet 13 I17.out vss! vss! "w 20 1 .8 "
i +5 nfet vss! I17.out 11 vss! "w 20 1 .8 "
i +4 nfet 11 17 3.qbar vss! "w 20 1 .8 "
i +3 nfet vss! d_in 2 vss! " 16 1 .8 "
i +2 nfet 2 4 13.Y vss! "w 16 1 .8 "
i +1 nfet 13.Y 4 1 vss! "w 16 1 .8 "
i +0 nfet 1 d_in vss! vss! "w 16 1 .8 "
s sin00d I9 clr 4 vcc! vss! ;
s snd02c I8 d_in 4 5 vcc! vss! ;
s snr02c I7 clkm clr 7 vcc! vss! ;
s snr02c I6 clks clr 10 vcc! vss! ;
s sin00d I10 5 I17.out vcc! vss! ;
s sin00d I11 7 17 vcc! vss! ;
s sin00d I12 10 25 vcc! vss! ;
E synccell4
EndSubcktDef
```

*Figure 6g* result

SCOMP ($Revision: S1.0 $)
    (c) Copyright 1990 Sun Micro Systems.
Reading "ns"...
Reading "ne"...

******************Comparing Subckt snr02c *************

***************************************************************
    Subckt Name               No. Insts        No. Devices:

Total Devices in snr02c                            4
***************************************************************

Comparing Subckt snr02c schematic to Subckt snr02c layout
Reducing schematic network...
Reducing layout network...
5 corresponding node names found.
Initial network trace...
Full network trace...
Networks Match...
Subckts Match

#########Mismatched   node   names###########
               Schematic Node     Layout Node
              ---------------    ---------------

!!!!!!!!!!!!!!!!!!!!!!!!!!!!!!!!!!!!!!!!!!!!!!!!!block snr02c LVS Clean!!!!!!!!!!!!!!!!!!!!!!!!!!!!!!!!!!!!

******************Comparing Subckt sin00d ***********

| Subckt Name | No. Insts: | No. Devices: |

Total Devices in sin00d                                                    2
*************************************************************
Comparing Subckt sin00d schematic to Subckt sin00d layout
Reducing schematic network . . .
Reducing layout network . . .
4 corresponding node names found.
Initial network trace . . .
Full network trace . . .
Networks Match . . .
Subckts Match

##############Mismatched node names###############
        Schematic Node    Layout Node
        ---------------    -----------

!!!!!!!!!!!!!!!!!!!!!!!!!!!!!!!!!!!!!block sin00d LVS Clean!!!!!!!!!!!!!!!!!!!!!!!!!!!!!!!
*******************Comparing Subckt snd02c **************

*************************************************************
| Subckt Name | No. Insts: | No. Devices: |

Total Devices in snd02c                                                    4
*************************************************************

Comparing Subckt snd02c schematic to Subckt snd02c layout
Reducing schematic network . . .
Reducing layout network . . .
5 corresponding node names found.

*Figure 6i*

Initial network trace . . .
Full network trace . . .
Networks Match . . .
Subckts Match

##########Mismatched node names############
       Schematic Node     Layout Node
       --------------     -----------

!!!!!!!!!!!!!!!!!!!!!!!!!!!!!!!!!!!!!!!!!!!!!!!block snd02c LVS Clean !!!!!!!!!!!!!!!!!!!!!!!!!!!!!!!!!!

*********************Comparing Subckt synccell4 *************

| Subckt Name | No. Insts: | No. Devices: |
|---|---|---|
| sin00d | 4 | 8 |
| sin02c | 2 | 8 |
| sin02c | 1 | 4 |

Total Devices in synccell4                   40
*****************************************************************
Comparing Subckt synccell4 schematic to Subckt synccell4 layout
Reducing schematic network . . .
Reducing layout network . . .
8 corresponding node names found.
Initial network trace . . .
Full network trace . . .
Networks Match . . .
Subckts Match
##############Mismatched node names##########
       Schematic Node     Layout
       --------------     ------

!!!!!!!!!!!!!!!!!!!!!!!!!!!!!!!!!!!!!!!!!!!!!!!block synccell4 LVS Clean!!!!!!!!!!!!!!!!!!!!!!!!!!!!!!!!!!

*Figure 6j*

METHOD FOR THE HIERARCHICAL COMPARISON OF SCHEMATICS AND LAYOUTS OF ELECTRONIC COMPONENTS

BACKGROUND OF THE INVENTION

1. Field of the Invention

The present invention relates to the field of validating schematic and layout designs of circuits to determine that the components and connection points logically specified by the schematic design appear in the same sequence in the physical layout of traces in layers of silicon which are representative of the components.

2. Art Background

In the design of a circuit, such as an ASIC custom VLSI, a logic design (often referred to as the schematic) is first developed to identify the logic components required to provide the desired functionality. For example, the schematic will identify the component or device type (e.g., a pfet transistor) and the signals connected to the leads of the component. This is illustrated by FIGS. 1a-1f. FIG. 1a shows the logic interconnection of the logic components which comprise the circuit. The schematic provides for four components, 5,6,7,8 four input terminals in1, in2, in3, in4 and one output terminal out1. FIG. 1b illustrates the schematic for the components 5,6 comprising two pfet devices and two nfet devices. Inputs I1, I2 (21,22) correspond to inputs in1, in2 of component 6 in FIG. 1a. Similarly, inputs 11, 12 correspond to inputs in3, i4 of component 5 in FIG. 1a. FIG. 1c illustrates the schematic for component 7 of FIG. 1a and FIG. 1d illustrates the schematic of component 8 in FIG. 1a.

Once the logic design is complete, a layout is generated which physically specifies the logic components in one or more layers of silicon. The layout identifies the physical layout of signal paths to be and components to be created in the integrated circuit fabrication process. FIGS. 2a-2f is illustrative of a layout for the schematic of FIGS. 1a-1e. FIG. 2a illustrates the layout for the schematic of FIG. 1a. The layout consists of four devices, two corresponding to the snd02a component of FIG. 1b, one corresponding to the snr02a component of FIG. 1c and one corresponding to the sin00a component of FIG. 1d. FIGS. 2b, 2c and 2d respectively show an enlarged view of the layout for components snd02a, snr02a and sin00a. The layout for component snd02a, FIG. 2b, consists of two pfet devices and two nfet devices having input terminals i1, i2 and output terminals out, vss! and vcc!. The layout for component snr02a, FIG. 2c, consists of two pfet devices, two nfet devices, input terminals i1, i2 and output terminals out, vss!, vcc!. The layout for component sin00a, FIG. 2d, consists of one pfet device and one nfet device having one input terminal i1 and three output terminals, out, vss! and vcc!.

From the logic design, a net list can be generated. The net list is a list of interconnected locations which identify the signal paths to and from components in the circuit. This is illustrated in FIGS. 1e-1f. FIGS. 1e-1f provide an illustrative net list for the schematic of FIG. 1a. Component snr02a corresponds to components 5,6 of FIG. 1a and the device of FIG. 1b. The net list identifies the input/output connections to the component, i1, i2 and out, the 2 nfet and 2 pfet devices and their input/output connections as well as the sizes of the devices (identified by the "w" before the dimensions). Similarly, the net list for snd02a, the component illustrated in FIG. 1c corresponding to the component 7 of FIG. 1a, and sin00a, the component illustrated in FIG. 1d and corresponding to component 8 of FIG. 1a are specified. The layout of FIG. 1a is defined in the net list by main circuit "patent2", input/output terminals in1, in2, in3, in4 and out1, and four instances of components; one instance of device snr02a, one instance of component sin00a and two instances (I1, I0) of component snd02a.

A second net list can be generated from the layout design. This is illustrated in FIGS. 2e-2f. FIGS. 2e-2f show the net list of the layout of FIG. 2a. Three block (also referred to as sub-circuit) net lists are defined, identifying the net lists for components sin00a, snr02a and snd02a. A main circuit net list identifies the instantiations of the blocks, one instantiation of sin00a (I3), one instantiation of snr02a (I2) and two instantiations of snd02a (I1, I0).

Although the layout design and schematic design represent the same circuit, the net lists for each may be quite different because the layout design may encompass multiple layers in which different portions of the same net of interconnected locations may reside in a plurality of smaller nets located on different layers. Single devices or components in the schematic might be represented by multiple parallel devices or components in the layout design. The layout net list for blocks might have different numbers of terminals to accommodate power and ground inputs as well as feed-thru holes to connect multiple layers in the layout design. For example, by visually comparing the net lists of FIGS. 1e-1f and FIGS. 2e-2f it can be seen that the layout net list of FIGS. 2e-2f includes additional terminals (vcc!, vss!) not found in the net list of the schematic (FIGS. 1e-1f).

To verify that the layout design provides the components and logic specified in the logic design, the net list of the logic design is compared to the net list of the layout design. Typically the net list compare process is performed in a "flat" manner. A flat comparison is a device by device comparison of the logic net list to the layout net list where a device is a primitive that can be represented in terms of the drawn layers in the layout, e.g., an nfet is represented as an overlapping region between a poly layer and an n diffusion layer and a pfet is represented as an overlapping region between poly layer and p-diffusion layer. This procedure works well but is quite time consuming, computationally intensive and requires a large block of memory in order to execute on a computer. Many different techniques exist for performing the actual comparison of devices in the layout and schematic. One such technique is referred to as "Graph Isomorphism." For further information see, N. Kubo, I. Shirokawa, H. Ozaki, "A Fast algorithm for Testing Graph Isomorphism", *Proceedings ISCAS Conference*, pp. 641-644 (1979); C. Ebeling and O. Zajicek, "Validating VLSI Circuit Layout by Wirelist Comparison" *IEEE Int. Conference on CAD*, pp. 172-173, September 1983; R. L. Spickelmier and A. R. Newton, "Wombat: A New Net list Comparison Program" *IEEE Int. Conference on CAD*, pp. 170-171, Sept. 1983; D. G. Corneil and D. G. Kirkpatrick, "A Theoretical Analysis of Various Heuristics for the Graph Isomorphism Problem," *SIAM Journal of Computing*, vol. 9, no. 2, pp. 281-197, May 1980.

Designs prepared today are quite complex. Generally a design is prepared in hierarchical layers wherein sub-circuits or blocks are defined to contain certain other devices blocks, ("sub-blocks") or components. For example, the circuit depicted in FIGS. 1a-1f and FIGS. 2a-2f is represented by 3 blocks sin00a, snd02a and snr02a. These blocks can then be utilized (i.e. instantiated) multiple times in the circuit.

A hierarchical design may include many hierarchical layers of blocks and components containing nested blocks. However, the hierarchies defined in a schematic design are not necessarily the same as hierarchies in the layout design. Furthermore, the identification of blocks may not be the same in the schematic and layout designs although they include the same components/devices. To compare a hierarchical design, the design is "flattened out" to the basic devices, replacing any blocks with the devices which comprise them. By flattening out the designs prior to comparison, the problems of inconsistent hierarchies and the names and compositions of the same are avoided. However, as stated above, designs have become more sophisticated and complex and the amount of computation time and memory needed to flatten out the design to individual devices and compare each occurrence of a device in the schematic design to a corresponding occurrence in the layout design have dramatically increased.

Furthermore, if any mismatches occur between the schematic and the layout circuits in a large and complex design, the mismatches are very difficult to fix and debug due to the size of the circuit after flattening. Typically it takes at least 4-5 iterations of circuit extraction and comparison before the layout design matches the schematic design. Thus it is not unusual for large designs to require 10-12 hours for each flat comparison. This is generally unacceptable.

SUMMARY OF THE INVENTION

It is therefore an object of the present invention to provide a means for comparing a schematic net list and a layout net list in a hierarchical manner whereby only a single occurrence of a block is compared at the device level and only the external connections to the block are compared in subsequent occurrences of the same block in different levels of hierarchies.

It is an object of the present invention to provide a means for adaptively comparing a schematic net list and a layout net list in a hierarchical manner.

The present invention takes advantage of the hierarchical nature of the design to perform a hierarchical comparison on as many blocks which can be matched between the layout and the logic design. Because the internal connections were previously verified when the first occurrence of the block was compared, repetition of lengthy comparisons of multiple occurrences of the same blocks in the designs is avoided and subsequent comparisons are performed simply by comparing the input and output connections to the block.

Each net list is reduced to a canonical net list in terms of common blocks between the layout and schematic designs. These reduced net lists are then compared hierarchically. Once a common block is verified, subsequent occurrences of the common block are verified simply by comparison of the terminals of the block and repeated comparison of all components and blocks within the block is avoided. Thus blocks are flattened on an as-needed basis and comparisons are performed at a simple, higher level, saving both memory space and time in performing the comparison.

BRIEF DESCRIPTION OF THE DRAWINGS

The objects, features and advantages of the present invention will be apparent from the following detailed description of the invention in which:

FIGS. 1a-1f illustrate a schematic design and net list of a circuit.

FIGS. 2a-2f illustrate a corresponding layout design and net list for the circuit of FIGS. 1a-1e.

FIGS. 5a-5d respectively illustrate a schematic net list, layout net list and exemplary output, illustrating hierarchical comparison of net lists and components.

FIGS. 6a-6j respectively illustrate a schematic net list, layout net list, and output generated illustrating the hierarchical comparison of net lists having different hierarchies.

NOTATION AND NOMENCLATURE

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases there should be borne in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer or other apparatus. In particular, various general purpose machines may be used with programs written in accordance with the teachings herein, or it may prove more convenient to construct more specialized apparatus to perform the required method steps. The required structure for a variety of these machines will appear from the description given below.

DETAILED DESCRIPTION OF THE INVENTION

General System Configuration

Figure 1A:
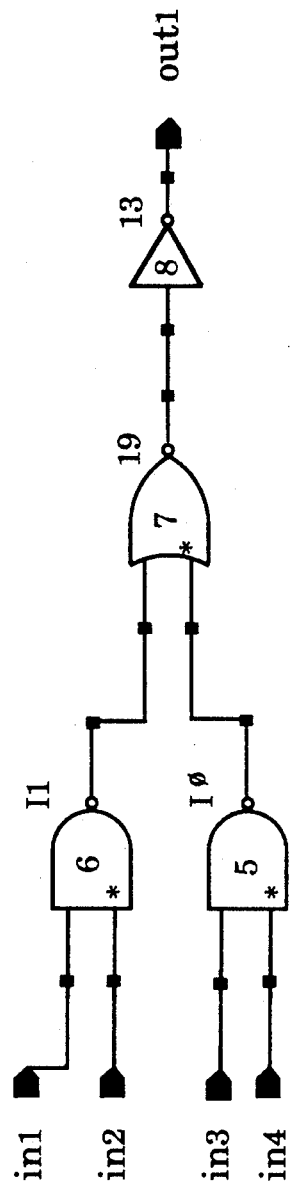
Figure 1D:
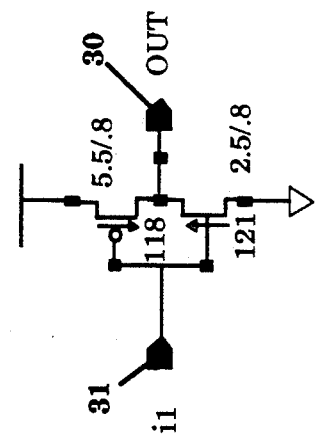
Figure 1C:
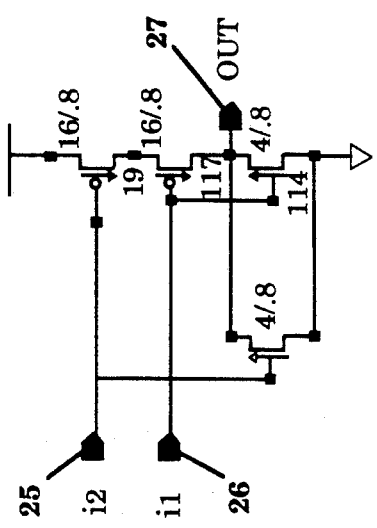
Figure 1B:
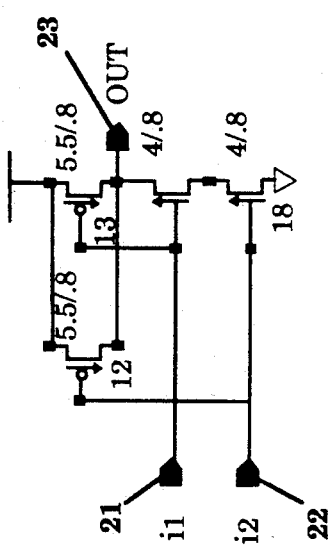
Figure 3:
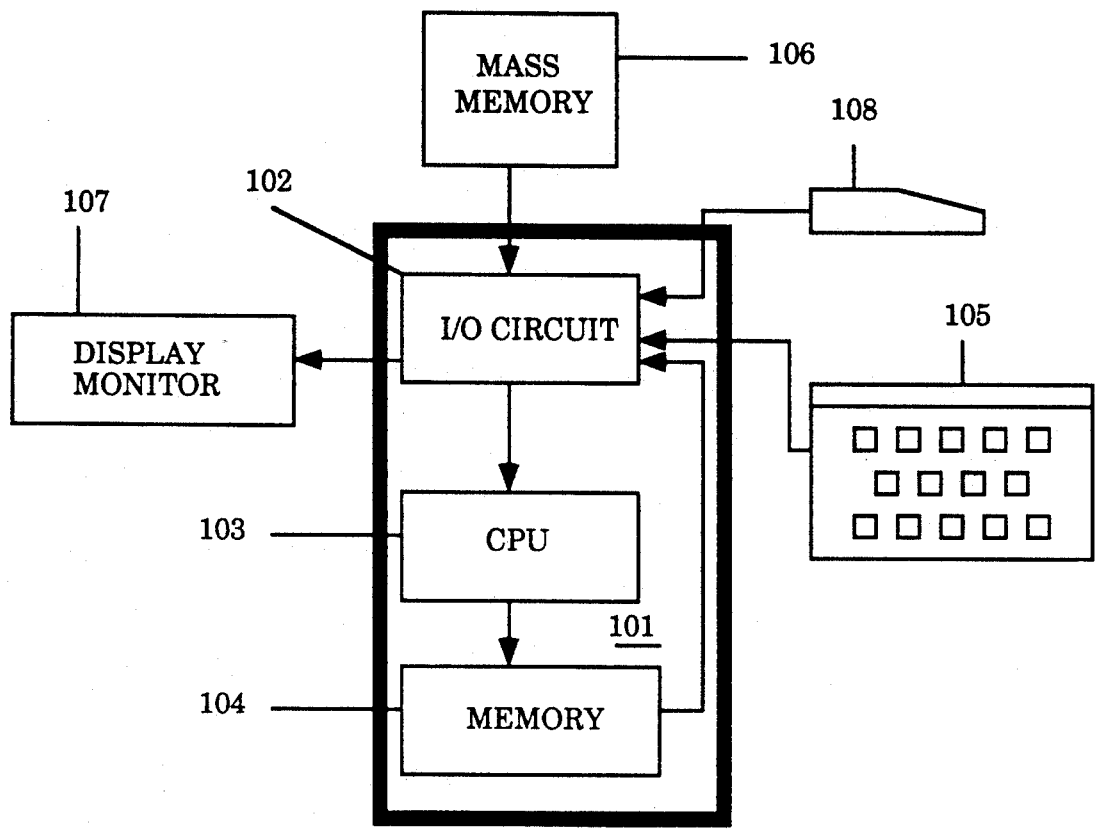
FIG. 3 is a block diagram representation of an exemplary computer system utilized in the preferred embodiment of the present invention.

FIG. 3 shows a typical computer-based system for performing hierarchical comparisons of schematic and layout designs according to the present invention. Shown there is a computer 101 which comprises three major components. The first of these is the input/output (I/O) circuit 102 which is used to communicate information in appropriately structured form to and from the other parts of the computer 101. Also shown as a part of computer 101 is the central processing unit (CPU) 103 and memory 104. These latter two elements are those typically found in most general purpose computers and almost all special purpose computers. In fact, the several elements contained within computer 101 are intended to be representative of this broad category of data processors. Particular examples of suitable data processors to fill the role of computer 101 include machines manufactured by Sun Microsystems, Inc., Mountain View, Calif. Other computers having like capabilities may of course be adapted in a straightforward manner to perform the functions described below.

Also shown in FIG. 3 is an input device 105, shown in typical embodiment as a keyboard. It should be understood, however, that the input device may actually be a card reader, magnetic or paper tape reader, or other well-known input device (including, of course, another computer). A mass memory device 106 is coupled to the I/O circuit 102 and provides additional storage capability for the computer 101. The mass memory may include other programs and the like and may take the form of a magnetic or paper tape reader or other well known device. It will be appreciated that the data retained within mass memory 106, may, in appropriate cases, be incorporated in standard fashion into computer 101 as part of memory 104.

In addition, a display monitor 107 is illustrated which is used to display messages or other communications to the user. Such a display monitor may take the form of any of several well-known varieties of CRT displays. A cursor control 108 is used to select command modes and edit the input data, and in general provides a more convenient means to input information into the system.

Process Description

In the process of the present invention, the names of the blocks identified in the net lists are first compared. If the same name exists on the layout and logic net lists, it is initially assumed that the blocks are the same and the block components (blocks and devices) of the block are compared to determine if they are the same. If the elements of the block match, then the blocks are determined to be the same and a correspondence list is generated. This correspondence list has a pair of entry points associated with each terminal or node of the block design. The first entry is the schematic pin position and the second entry is the pin position of the corresponding layout pin. At higher hierarchical levels it is preferred that for each placement of the block it is verified that a matched net goes to the terminals which belong to an entry pair in the correspondence list. Subsequent instantiations of the block are thus compared at the block level without comparing the individual elements of the block each time.

This process begins at the lowest hierarchical level and continues up the hierarchy of blocks until all possible blocks/sub-blocks are matched. For each level of hierarchy, schematic and layout representations are reduced to a common form in terms of placements (instantiations) of lower level matched blocks and devices. These two representations are then compared in terms of blocks and devices.

Figure 4A:
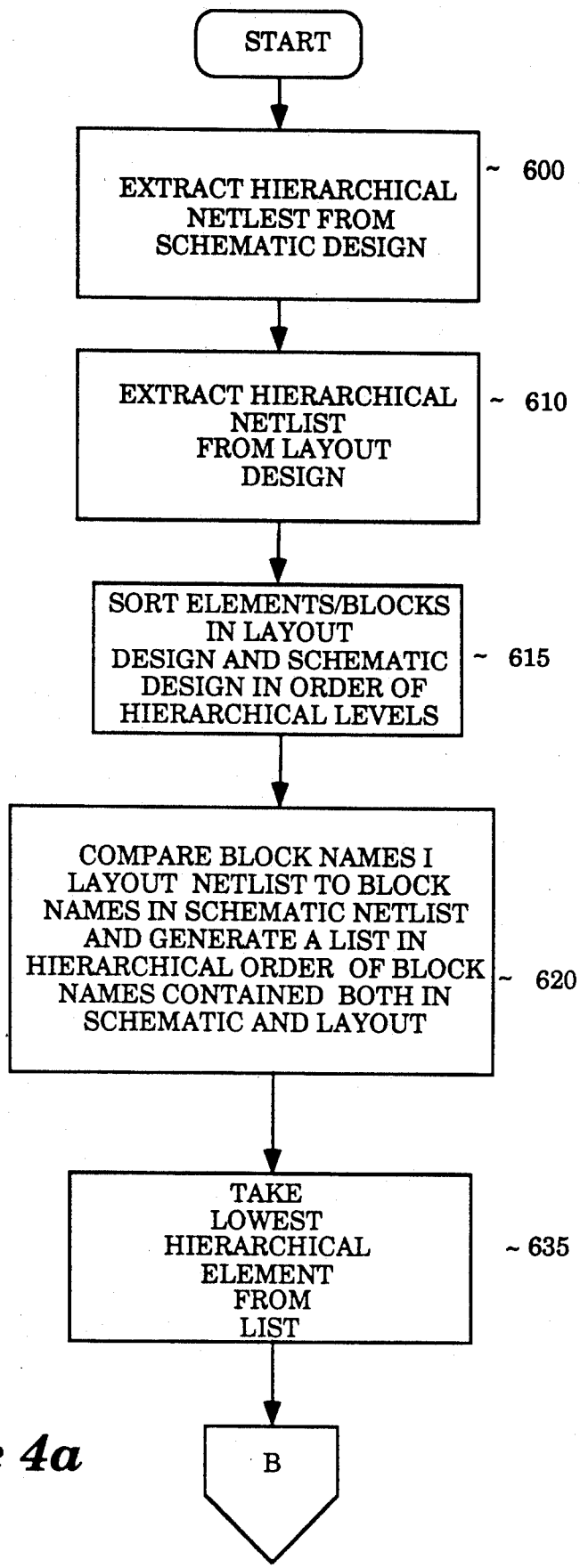
FIGS. 4a and 4b is a flowchart which illustrate the preferred embodiment of the present invention.
Figure 4B:
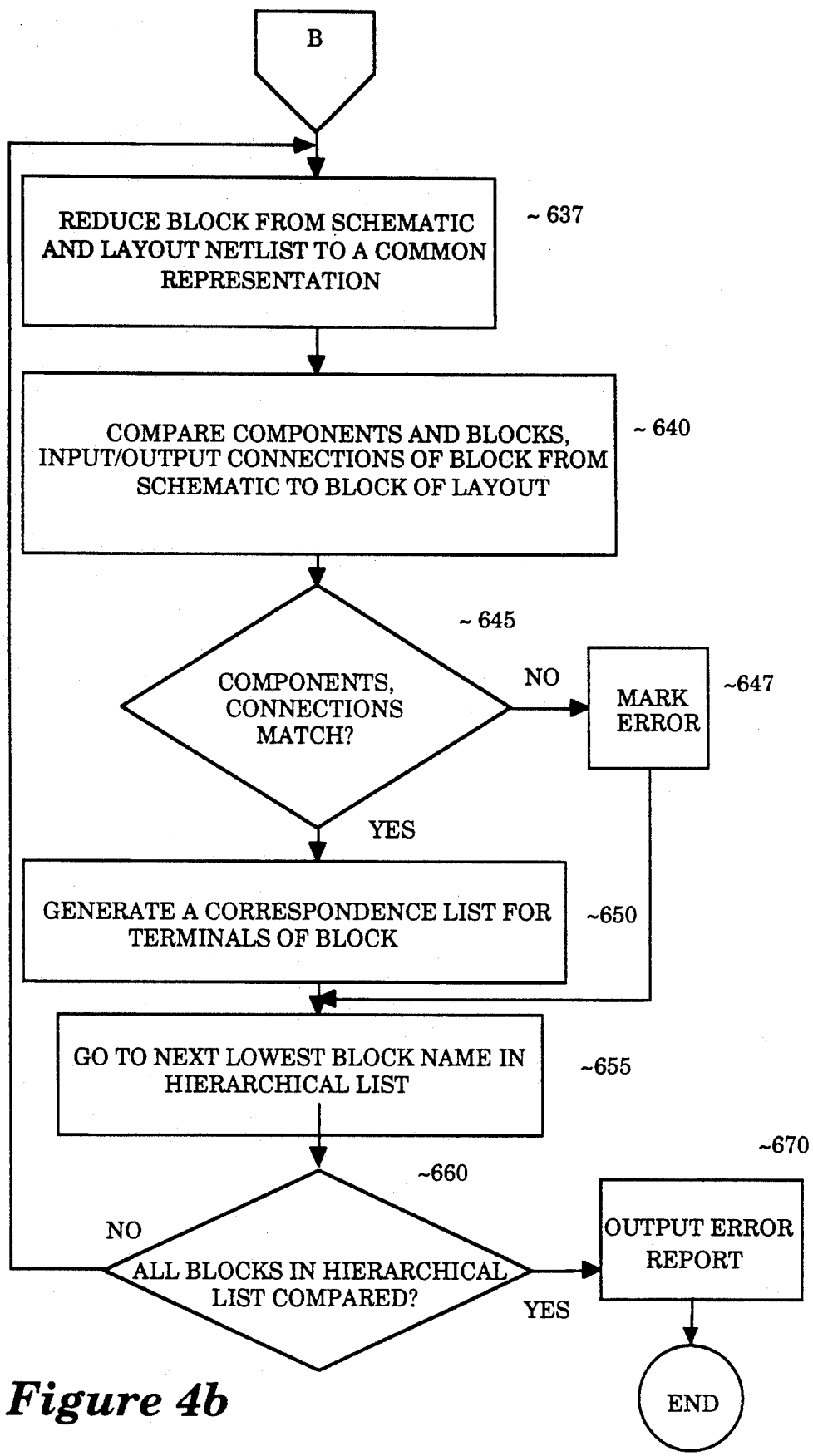

The process is better illustrated with reference to the flowchart depicted in FIGS. 4a and 4b.

At step 600 a hierarchical net list is extracted from the schematic design and at step 610 a hierarchical net list is extracted from the layout design. The hierarchical net list contains a listing of the blocks and devices which comprise the circuit and the blocks and devices instantiated within each block. At step 615, the various hierarchical elements are sorted in order of hierarchical levels starting with the highest order first. The net lists may be sorted by examining the components within each block and sorting the block containing instantiations of other blocks to be at a higher hierarchical level than the instantiated blocks. Similarly, each block may be identified by a hierarchical level identifier for quick sorting or pre-sorted in hierarchical order.

At step 620, starting with the lowest level the block name in the schematic net list is compared to the block names in the layout net list. If there is no match then that block is marked for flattening, i.e. all instantiations of the block would be flattened in terms of its components (devices and lower level blocks) for verification. A list of blocks for which block names in schematic and layout net list are same is formed and sorted in order of hierarchical levels. Starting from the lowest and block level, set 635, in the common name list, the schematic and the layout representation for the common named block are, at step 637, reduced to a common representation in terms of instantiations of matched (common-named) lower level blocks and devices, flattening all the instantiations of the marked blocks. At step 640 the two canonical representations are compared. A device comparison technique, such as graph isomorphism, is used to perform the device comparison. At step 645, if all devices, instances of lower level blocks and connections match in the two representations then at step 650 a pin correspondence list is generated for the terminals in the schematic representation. The correspondence list contains an identification of pairs, entry points (terminals) from the layout and schematic net lists which correspond to one another. This is done at the node level (i.e., terminals internal and external to the block) to assist the user in identifying errors caused by misconnections of terminals.

The correspondence list is used to simplify subsequent comparisons of instances of this block in blocks at the higher levels of the hierarchy. To verify subsequent instantiations of a verified block, the correspondence list is utilized to compare the entry points of the subsequent instantiations. If the entry point pairs as specified in the correspondence list match, the instantiation of the block is verified without the need to compare each component within the block. At step 655 the process is repeated for the next block in the list until all hierarchical levels have been compared and verified, step 660. A report is then generated, step 670, describing the test results. If the comparison at step 647 fails then the errors are reported for the block. If the error is total such that subsequent comparisons cannot be performed, the process is halted.

An example of a simple test executed according to a preferred embodiment of the present invention is shown in FIGS. 5a-5d. FIG. 5a shows a listing of the net list for the schematic design comprising a block "soai21b" consisting of 2 pfet and 3 nfet devices. The main circuit is identified as fr_muxlgc consisting of block soai21b at instance 123 having nodes, brad inp1 inp2 d4 d5 d6 d7 inp3 prad and outp drat.

The net list for the layout design is shown in FIG. 5b which also has a block identified as "soai21b" having three pfet and three nfet devices which are instantiated inside main circuit fr_muxlgc having an instance numbered 123 of component soai21b. Thus when the two circuit net lists are compared as shown in FIGS. 5c-5d, the hierarchical list will consist of block soai21b and block fr_muxlgc and block soai21b, at the lower hierarchical level will be compared first. As identified in the listing of FIGS. 5c-5d the schematic net list for soai21b (referred to in FIGS. 5c-5d as "network") is reduced to the component device, in the present example, the device level, as in the layout net list, in order to compare the blocks for verification. If block soai21b contained instances of blocks, these blocks would have been previously verified because the blocks would be at a lower hierarchical level and verification of the instances of the blocks within soai21b would be achieved through comparison of the correspondence list. However, if a block within soai21b had been marked as not having corresponding blocks in both the layout and schematic, the block would be flattened and compared on the device level.

Through comparison of terminal names, six corresponding node names are found. In this embodiment, it is initially assumed that the similarly named terminals correspond, but correspondence is checked during "full network trace" for complete verification. during full network trace, the network of components and nodes are compared to determine if the connectivity in the layout and schematic are the same. Each node is examined to determine the devices and/or blocks connected to the node. For each device connected to the node, it is verified that the same type of device (e.g. pfet) is connected in both layout and schematic to the same terminal of the device. This can be determined according to the terminal position in the list of terminals. For the instantiation of the device, the position of the terminal in the list corresponds to a specific terminal in the device.

For example, in FIGS. 5a and 5b, it is verified that pfet instance 4 "4 pfet" has the first terminal (4.D) connected to the same node. Although the first terminal in the present illustration is identified by the same name in the layout and schematic, it is possible terminals to be identified by different names and will be identified as such in the correspondence list.

Similarly, instances of previously verified blocks are verified by comparing the block names and the nodes as specified by the correspondence list. If nodes of the present instance of the block do not equal the nodes in the correspondence list, an error is noted.

After the networks are verified, the device sizes are compared to determine if the sizes of corresponding devices in the schematic and layout match. This is determined by comparing the sizes specified in the net list, e.g. "w 16 1.8" for pfet instance 4 in FIG. 5a. If the device sizes do not match an error is generated. If the sizes match the system will report "sub ckts match", indicating that the blocks match (i.e., "clean") and the correspondence list is generated. Once block soai27b is verified, the block is identified as being "clean." and the next hierarchy level is then compared. In the present illustration it is the highest level although it should be evident that this process applies to a multi-hierarchy type system having a large number of levels. The circuit fr_muxlgc is then compared to the circuit in the layout design. The same verification process is performed, fr_muxlgc is found to have four nodes, inp1, inp2 outp which correspond to layout node inp1, inp2, inp3 and outp in the layout design identifying that the comparison is clean and the designs match.

FIGS. 6a-6j illustrate a second comparison between a schematic FIGS. 6a-6d and layout FIGS. 6e-6g in which the hierarchies do not precisely match and therefore some of the elements or sub-circuits must be flattened out to the component level for the comparison. For example, referring to FIGS. 6a-6d, the schematic design comprises a circuit syncce114 consisting of elements sync_ce114, nand2, sor02d, sin00d, san02d and the layout design (FIGS. 6e-6g) comprises a circuit syncce114 consisting of the elements sin00d, snd02c, snr02c and a number of nfets and pfets. Close examination of the description for syncce114 in the schematic and the layout design indicates that the hierarchical structures in the designs are not the same. However, that does not mean that the net lists do not match when flattened to at the component level. Referring to FIGS. 6h-6j, sub-circuit snr02c in the schematic is compared to the sub-circuit snr02c in the layout and are found to match. In addition, the sub-circuits sin00d and snd02c in the layout design are compared to sub-arrays sin00d and snd02c respectively in the schematic design. However, the remaining sub-circuits, for example, the nfets and pfets individually listed in the layout design, FIGS. 6e-6g, and the sub-circuits sync_ce114 nand2, sor02d and san02d in the schematic design, FIGS. 6a-6d, are not found to have corresponding sub-circuits. The schematic representation of syncce114 is reduced to a representation in terms of sin00d, sn02c, snd02c and devices nfet and pfet. Instantiations of syn_ce114, nand2 are flattened. The layout representation is also transformed into a representation in terms of sin00d, sn02c, snd02c and devices nfet and pfet. These two transformed representations are then compared to verify the validity of the layout design.

While the invention has been described in conjunction with the preferred embodiment, it is evident that numerous alternatives, modifications, variations and uses will be apparent to those skilled in the art in light of the foregoing description.

What is claimed is:

1. A method for verifying a hierarchical circuit design, said circuit design comprising a schematic design, said schematic design comprising a net list specifying the logic devices of he circuit and the interconnection of the logic devices, and a layout design, said layout design comprising a net list specifying the physical layout and interconnection of devices, said schematic and layout designs being specified in hierarchical order wherein devices in each design are organized into blocks and blocks of a higher hierarchical order comprises blocks of a lower hierarchical order an devices, each block identified by a block name, said method comprising the steps of:

receiving the schematic net list and layout net list;

sorting separately the schematic net list and layout net list in hierarchical order;

comparing the schematic net list and layout net list to determine the blocks which occur in both the schematic net list and layout net list and;

marking those blocks which do not occur in both the schematic net list and layout net list;

generating a block list of unmarked blocks in hierarchical order which occur in both the schematic net list and layout net list;

comparing each unmarked block from the block list from the lowest hierarchical order to the highest hierarchical order comprising the steps of;

comparing a first instantiation of an unmarked lower hierarchical order block instantiated int he block to be compared by flattening the block to block components and comparing each instantiation of a block component in the schematic to determine if a corresponding block component at the same location connecting to the same nodes exists in the layout design, said instantiation verified if each instantiation of a block component in the schematic corresponds to a component in the layout design at the same location connecting to the same nodes, adding the first instantiation of an unmarked lower hierarchical level block to a correspondence list, said correspondence list comprising a list of blocks by name and nodes into and out of each block, each of said nodes comprising an entry pair, a first element of the entry pair identifying the entry portion in the schematic for then done and a second element identifying the corresponding entry point in the layout, comparing subsequent instantiations of verified unmarked lower hierarchical level blocks instantiated in the block by referencing the correspondence list to determine if the entry points in the schematic and layout of the instantiated block for each node of the block correspond, whereby if the entry points of the instantiated lower hierarchical block correspond as specified in the correspondence list, the instantiation of the block is verified, and comparing instantiations of devices and marked lower hierarchical blocks by flattening each instantiation of each marked lower hierarchical block to devices and comparing each instantiation of a device in the schematic to determine if a corresponding device at the same location connecting to the same nodes exists in the layout design whereby the instantiation of the device is verified, and reporting an error report of non-corresponding devices and instantiations of lower hierarchical level blocks;

whereby a design is verified in the minimal amount of time with a decrease in computational overhead because once a block is verified and added to the correspondence list, all subsequent instantiations of the same block are verified simply by verifying the correspondence of entry points at the nodes as specified in the correspondence list.

2. The method for verifying a hierarchical circuit design as set forth in claim 1, wherein the step of comparing a first instantiation of an unmarked block compares the block from the schematic to the block from layout using a graph isomorphism technique.

3. The method for verifying a hierarchical circuit design as set forth in claim 1, wherein each block is further identified by hierarchical identifier which identifies the hierarchical level the block belongs to and the step of generating a list of block names in hierarchical order comprises sorting the blocks according to the hierarchical identifier.

4. The method for verifying a hierarchical circuit design as set forth in claim 1, wherein the step of generating a list of block names in hierarchical order comprises determining the location of each block in the hierarchy in accordance with the blocks contained within the block and sorting the blocks in hierarchical order.

5. The method for verifying a hierarchical circuit design as set forth in claim 1, wherein the step of comparing a first instantiation of an unmarked hierarchical block further comprises comparing the size of the block in the schematic to the size of block in the layout to determine if the blocks are equal in size.

6. The method for verifying a hierarchical circuit design as set forth in claim 1, wherein the step of comparing subsequent instantiations of an unmarked hierarchical block further comprises comparing the size of the block in the schematic to the size of block in the layout to determine if the blocks are equal in size.

7. The method for verifying a hierarchical circuit design as set forth in claim 1, wherein each block is identified by a block name and the step of comparing the schematic net list and layout net list to initially determine the blocks which occur in both the schematic net list and layout net list comprises comparing the names of the blocks.

8. The method for verifying a hierarchical circuit design as set forth in claim 1, wherein block components comprise:

devices determined from flattening each unverified instantiation of an unmarked lower hierarchical level block and each marked block to the device level; and subsequent instantiations of verified lower hierarchical level blocks.

9. A method for verifying a hierarchical circuit design, said circuit design comprising a schematic design, said schematic design comprising a net list specifying the logic devices of the circuit and the interconnection of the logic devices, and a layout design, said layout design comprising a net list specifying the physical layout and interconnection of devices, said schematic and layout designs being specified in hierarchical order wherein devices in each design are organized into blocks and blocks of a higher hierarchical order comprises blocks of a lower hierarchical order and devices, each block identified by a block name, said method comprising the steps of:

receiving the schematic net list and layout net list;

sorting separately the schematic net list and layout net list in hierarchical order;

comparing the schematic net list and layout net list to determine the block names which occur in both the schematic net list and layout net list and;

marking those blocks which do not occur in both the schematic net list and layout net list;

generating a block list of names of unmarked blocks in hierarchical order which occur in both the schematic net list and layout net list;

comparing each unmarked block from the block list from the lowest hierarchical order to the highest hierarchical order by comparing components and connections between blocks of the same name in the schematic net list and layout net list, said comprising the steps of;

comparing a first instantiation of an unmarked lower hierarchical level block instantiated in the block to be compared by flattening the block to the device level and comparing each instantiation of a device in the schematic to determine if a corresponding device at the same location connecting to the same nodes exists in the layout design, adding the first instantiation of an unmarked lower hierarchical level block to a correspondence list, said correspondence list comprising a list of block names and nodes into and out of each block, each of said nodes comprising an entry pair, a first element of the entry pair identifying the entry point in the schematic for the node and a second element identifying the corresponding entry point in the layout, comparing subsequent instantiations of unmarked lower hierarchical level blocks instantiated in the block by referencing the correspondence list to determine if the entry points in the schematic and layout of the instantiated block for each node of the block correspond, whereby if the entry points of the instantiated lower hierarchical block correspond as specified in the correspondence list, the instantiation of the block is verified, and comparing instantiations of devices and marked lower hierarchical blocks by flattening each instantiation of each marked lower hierarchical block to devices and comparing each instantiation of a device in the schematic to determine if a corresponding device at the same location connecting to the same nodes exists in the layout design whereby the instantiation of the device is verified, and reporting an error report of non-corresponding devices and instantiations lower hierarchical level blocks;

whereby a design is verified in the minimal amount of time with a decrease in computational overhead because once a block is verified and added to the correspondence list, all subsequent instantiations of the same block are verified simply by verifying the correspondence of entry points at the nodes as specified in the correspondence list.

10. The method for verifying a hierarchical circuit design as set forth in claim 9, wherein the step of comparing a first instantiation of an unmarked block compares the block from the schematic to the block from layout using a graph isomorphism technique.

11. The method for verifying a hierarchical circuit design as set forth in claim 9, wherein the step of comparing a first instantiation of an unmarked hierarchical block further comprises comparing the size of the block in the schematic to the size of block in the layout to determine if the blocks are equal in size.

12. The method for verifying a hierarchical circuit design as set forth in claim 9, wherein the step of comparing subsequent instantiations of an unmarked hierarchical block further comprises comparing the size of the block in the schematic to the size of block in the layout to determine if the blocks are equal in size.

13. A test apparatus for verifying a hierarchical circuit design, said circuit design comprising a schematic design, and schematic design comprising a net list specifying the logic devices of the circuit and the interconnection of the logic devices, and a layout design, said layout design comprising a net list specifying the physical layout and interconnection of devices, said schematic and layout designs being specified in hierarchical order wherein devices in each design are organized into blocks and blocks of a higher hierarchical order comprises blocks of a lower hierarchical order and devices, each block identified by a block name, said testing apparatus comprising a central processing unit (CPU) memory, and input/out means, said apparatus further comprising:

input means for receiving the schematic net list and layout net list;

sorting means for separately sorting the schematic net list and layout net list in hierarchical order;

a first comparison means for comparing the schematic net list and layout net list to determine the block names which occur in both the schematic net list and layout net list and marking those blocks which do not occur in both the schematic net list and layout net list;

extraction means for generating a block list of names of unmarked blocks in hierarchical order which occur in both the schematic net list and layout net list;

a correspondence list comprising a list of unmarked block names and nodes into and out of the block, each of said nodes comprising an entry pair, a first element of the entry pair identifying the entry point in the schematic for the node and a second element identifying the corresponding entry point in the layout, a bock name being included in the correspondence list if the components and connections of a block in the schematic net list match the components and connections of a block of the same name in the layout net list;

a second comparison means for comparing unmarked blocks from the lowest hierarchical order to the highest hierarchical order, said comparison means comparing components and connections between unmarked blocks of the same name in the schematic net list and layout net list, said second comparison means comprising;

means for comparing a first instantiation of an unmarked lower hierarchical level block to verify the block by flattening the block to block components and comparing each instantiation of a block component in the schematic design to determine if a corresponding component at the same location connecting to the same nodes exists in the layout design, and verifying the instantiation of the block and adding the instantiation to the correspondence list if each block component in the schematic corresponds to a block component in the layout.

means for comparing subsequent instantiations of unmarked lower hierarchical level blocks by referencing the correspondence list to determine if the entry points in the schematic design and layout design of the instantiated block for each node of the block correspond, whereby if the entry points of the instantiated lower hierarchical block correspond as specified in the correspondence list, the instantiation of the block is verified, and means for comparing instantiations of devices and marked lower hierarchical blocks by flattening each instantiation of each marked lower hierarchical block to devices and comparing each instantiation of a device in the schematic design to determine if a corresponding device at the same location connecting to the same nodes exists in the layout design whereby the instantiation of the device is verified, and reporting means for generating an error report of non-corresponding devices and instantiations lower hierarchical level blocks;

whereby a design is verified in the minimal amount of time with a decrease in computational overhead because once a block is verified and added to the correspondence list, all subsequent instantiations of the same block are verified simply by verifying the correspondence of entry points at the nodes as specified in the correspondence list.

14. The test apparatus for verifying a hierarchical circuit design as set forth in claim 13, wherein the means for comparing a first instantiation of an unmarked block comprises a graph isomorphism comparison mechanism.

15. The test apparatus for verifying a hierarchical circuit design as set forth in claim 13, wherein the means for comparing a first instantiation of an unmarked hierarchical block further comprises a means for comparing the size of the block in the schematic to the size of block in the layout to determine if the blocks are equal in size.

16. The test apparatus for verifying a hierarchical circuit design as set forth in claim 13, wherein the means for comparing subsequent instantiations of an unmarked hierarchical block further comprises means for comparing the size of the block in the schematic to the size of block in the layout to determine if the blocks are equal in size.

17. The test apparatus for verifying a hierarchical circuit design as set forth in claim 13, wherein block components comprise:

devices determined from flattening each unverified instantiation of an unmarked lower hierarchical level block and each marked block to the device level; and subsequent instantiations of verified lower hierarchical level blocks.

18. A test apparatus for verifying a hierarchical circuit design, said circuit design comprising a schematic design, said schematic design comprising at net list specifying the logic devices of the circuit and the interconnection of the logic devices, and a layout design, said layout design comprising a net list specifying the physical layout and interconnection of devices, said schematic and layout designs being specified in hierarchical order wherein devices in each design are organized into blocks and blocks of a higher hierarchical order comprises blocks of a lower hierarchical order and devices, each block identified by a block name, said testing apparatus comprising a central processing unit (CPU) memory, and input/out means, said apparatus further comprising:

input means for receiving the schematic net list and layout net list;

sorting means for separately sorting the schematic net list and layout net list in hierarchical order;

a first comparison means for comparing the schematic net list and layout list to determine the block names which occur in both the schematic net list and layout net list and marking those blocks which do not occur in both the schematic net list and layout net list;

extraction means for generating a block list of names of unmarked blocks in hierarchical order which occur in both the schematic net list and layout net list;

a correspondence list comprising a list of unmarked block names and nodes into an out of the block, each of said nodes comprising an entry pair, a first element of the entry pair identifying the entry point in the schematic for the node and a second element identifying the corresponding entry point in the layout, a block name being included in the correspondence list if the components and connections of a block in the schematic net list match the components and connections of a block of the same name in the layout net list a second comparison means for comparing unmarked blocks form the lowest hierarchical order to the highest hierarchical order, said comparison means comparing components and connections between unmarked blocks of the same name in the schematic net list and layout net list, said second comparison means comprising;

means for comparing the first instantiation of an unmarked lower hierarchical level blocks to verify the block by flattening the block to the device level and comparing each instantiation of a device in the schematic design to determine if a corresponding device at the same location connecting to the same nodes exists in the layout design, whereby the instantiation of the device is verified and added to the correspondence list, means for comparing subsequent instantiations of unmarked lower hierarchical level blocks by referencing the correspondence list to determine if the entry points in the schematic design and layout design of the instantiated block of reach node of the block correspond, whereby if the entry points of the instantiated lower hierarchical block correspond as specified in the correspondence list, the instantiation of the block is verified, and means for comparing instantiations of devices and marked lower hierarchical blocks by flattening each instantiation of each marked lower hierarchical block to devices and comparing each instantiation of a device in the schematic design to determine if a corresponding device at the same location connecting to the same nodes exists in the layout design whereby the instantiation of the device is verified, and reporting means for generating an error report of non-corresponding devices and instantiations lower hierarchical level blocks;

whereby a design is verified, in the minimal amount of time with a decrease in computational overhead because once a block is verified and added to the correspondence list, all subsequent instantiation of the same block are verified simply by verifying the correspondence of entry points at the nodes as specified in the correspondence list.

19. The test apparatus for verifying a hierarchical circuit design as set forth in claim 18, wherein the means for comparing a first instantiation of an unmarked block comprises a graph isomorphism comparison mechanism.

20. The test apparatus for verifying a hierarchical circuit design as set forth in claim 18, wherein the means for comparing a first instantiation of an unmarked hierarchical block further comprises a means for comparing the size of the block in the schematic to the size of block in the layout to determine if the blocks are equal in size.

21. The test apparatus for verifying a hierarchical circuit design as set forth in claim 18, wherein the means for comparing subsequent instantiations of an unmarked hierarchical block further comprises means for comparing the size of the block in the schematic to the size of block in the layout to determine if the blocks are equal in size.

* * * * *

UNITED STATES PATENT AND TRADEMARK OFFICE
CERTIFICATE OF CORRECTION

PATENT NO. : 5,249,133
DATED : September 28, 1993
INVENTOR(S) : Batra

It is certified that error appears in the above-identified patent and that said Letters Patent is hereby corrected as shown below:

In column 8, claim 1 at line 62, please delete " he " and insert -- the --.

In column 9, claim 1 at line 1, please delete " an " and insert -- and --.

In column 9, claim 1 at line 19, please delete " order " and insert -- level --.

In column 9, claim 1 at line 19, please delete " int he " and insert -- in the --.

In column 12, claim 13 at line 40, please delete " bock " and insert -- block --.

In column 14, claim 18 at line 44, please delete " of reach " and insert -- for each --.

Signed and Sealed this

Twenty-first Day of October 1997

Attest:

BRUCE LEHMAN

Attesting Officer

Commissioner of Patents and Trademarks